US012791266B2

(12) United States Patent
Yang et al.

(10) Patent No.: US 12,791,266 B2
(45) Date of Patent: Nov. 10, 2026

(54) LEAK-LIQUID GUIDING STRUCTURE AND WATER-COOLING AND HEAT-DISSIPATION SYSTEM USING SAME

(71) Applicant: Delta Electronics, Inc., Taoyuan City (TW)

(72) Inventors: Ming-Tang Yang, Taoyuan City (TW); Bo-Yen Chen, Taoyuan City (TW)

(73) Assignee: Delta Electronics, Inc., Taoyuan City (TW)

( * ) Notice: Subject to any disclaimer, the term of this patent is extended or adjusted under 35 U.S.C. 154(b) by 356 days.

(21) Appl. No.: 18/444,668

(22) Filed: Feb. 17, 2024

(65) Prior Publication Data

US 2024/0369315 A1 Nov. 7, 2024

Related U.S. Application Data

(60) Provisional application No. 63/463,960, filed on May 4, 2023.

(30) Foreign Application Priority Data

Sep. 22, 2023 (CN) ......................... 202311234655.0

(51) Int. Cl.
*F28F 17/00* (2006.01)
*H05K 7/20* (2006.01)

(52) U.S. Cl.
CPC ......... *F28F 17/00* (2013.01); *H05K 7/20263* (2013.01); *H05K 7/20272* (2013.01)

(58) Field of Classification Search
CPC ........... H05K 7/20272; H05K 7/20772; H05K 7/20281; H05K 7/20327; H05K 7/20509;
(Continued)

(56) References Cited

U.S. PATENT DOCUMENTS 7,156,423 B2 * 1/2007 Marks ...................... F16L 39/00 285/286.1
7,639,499 B1 * 12/2009 Campbell .......... H05K 7/20772 165/104.19

(Continued)

FOREIGN PATENT DOCUMENTS

CN 211345789 U 8/2020
CN 211641874 U 10/2020

(Continued)

*Primary Examiner* — Michael A Matey
(74) *Attorney, Agent, or Firm* — KIRTON McCONKIE; Evan R. Witt

(57) ABSTRACT

A water-cooling and heat-dissipation system is disclosed and includes a heat exchange device, an electronic device, a plurality of male-and-female connectors and a plurality of leak-liquid guiding structures. The plurality of male-and-female connectors are disposed between the heat exchange device and the electronic device to allow a coolant flowing therebetween. Each leak-liquid guiding structure is correspondingly disposed below each male-and-female connector, and includes an inclined surface. The inclined surface is introduced from a lateral wall of the heat exchange device or a lateral wall of the electronic device, and extended through a connection port of the corresponding male-and-female connector. When the coolant is leaked from one of the connection ports of the plurality of male-and-female connectors, a leakage liquid is formed and flows along the corresponding inclined surface to the lateral wall of the heat exchange device or the lateral wall of the electronic device.

19 Claims, 14 Drawing Sheets

(58) Field of Classification Search
CPC ............... H05K 7/20763; H05K 7/208; H05K 7/20818; H05K 7/20263; F28D 2021/0031; F28D 1/00; F28D 9/005; F28D 9/0093; G01M 3/04; G01M 3/186; B60L 53/16; F16L 37/00; F16L 37/008; F28F 2265/16; F28F 9/0258; F28F 17/00; H01R 13/5219; H01R 31/06
See application file for complete search history.

(56) References Cited

U.S. PATENT DOCUMENTS

| | | | | |
|---|---|---|---|---|
| 7,971,910 | B2 * | 7/2011 | Holt | F16L 41/086 285/13 |
| 9,351,428 | B2 * | 5/2016 | Eckberg | F16L 37/34 |
| 10,188,016 | B2 * | 1/2019 | Lunsman | H05K 7/20263 |
| 10,299,413 | B2 * | 5/2019 | Cui | H05K 7/1487 |
| 10,701,838 | B1 * | 6/2020 | Conroy | H05K 7/20781 |
| 11,199,466 | B2 | 12/2021 | Chen et al. | |
| 11,711,908 | B1 * | 7/2023 | Gao | H05K 7/20781 361/688 |
| 11,980,006 | B2 * | 5/2024 | Gao | H05K 7/20254 |
| 2004/0008483 | A1 * | 1/2004 | Cheon | G06F 1/20 361/699 |
| 2013/0048742 | A1 * | 2/2013 | Menden | F24F 5/0003 285/124.5 |
| 2013/0277008 | A1 * | 10/2013 | Ishikura | F28F 11/00 165/200 |
| 2013/0312846 | A1 * | 11/2013 | Eriksen | H05K 7/20772 137/315.01 |
| 2017/0254459 | A1 * | 9/2017 | Chen | H05K 7/20272 |
| 2017/0257980 | A1 * | 9/2017 | Fukunaga | F16L 37/40 |
| 2018/0131128 | A1 * | 5/2018 | Franz | H01R 13/5219 |
| 2018/0231295 | A1 * | 8/2018 | Akiyama | F25D 17/02 |
| 2018/0303007 | A1 * | 10/2018 | Gao | H05K 7/20781 |
| 2019/0390807 | A1 * | 12/2019 | Yanagisawa | F16L 37/088 |
| 2021/0100138 | A1 * | 4/2021 | Chen | B60L 53/302 |
| 2021/0348706 | A1 * | 11/2021 | Yang | H05K 7/20272 |
| 2021/0385978 | A1 * | 12/2021 | Shao | H05K 7/1489 |
| 2023/0061298 | A1 * | 3/2023 | Gao | G01M 3/38 |
| 2023/0063710 | A1 * | 3/2023 | Gao | H05K 7/20509 |
| 2023/0067321 | A1 * | 3/2023 | Gao | H05K 7/20272 |
| 2023/0152049 | A1 * | 5/2023 | Chen | F28F 9/0253 165/80.4 |
| 2023/0200007 | A1 * | 6/2023 | Gao | H05K 7/20272 361/679.53 |
| 2023/0225078 | A1 * | 7/2023 | Sun | H05K 7/20272 |
| 2025/0176131 | A1 * | 5/2025 | Heyes | H05K 7/20772 |
| 2026/0068087 | A1 * | 3/2026 | Farkas | F16K 31/06 |

FOREIGN PATENT DOCUMENTS

| | | | |
|---|---|---|---|
| CN | 213579962 | U | 6/2021 |
| TW | M477569 | U | 5/2014 |
| TW | I578890 | B | 4/2017 |
| TW | M574197 | U | 2/2019 |
| TW | I778773 | B | 9/2022 |

* cited by examiner

LEAK-LIQUID GUIDING STRUCTURE AND WATER-COOLING AND HEAT-DISSIPATION SYSTEM USING SAME

CROSS-REFERENCE TO RELATED APPLICATION

This application claims the benefit of U.S. Provisional Application No. 63/463,960 filed on May 4, 2023, and entitled "LEAKAGE LIQUID GUIDE STRUCTURE". This application also claims priority to China Patent Application No. 202311234655.0 filed on Sep. 22, 2023. The entireties of the above-mentioned patent application are incorporated herein by reference for all purposes.

FIELD OF THE INVENTION

The present disclosure relates to a leak-liquid guiding structure, and more particularly to a leak-liquid guiding structure and a water-cooling and heat-dissipation system using the same wherein the leak-liquid guiding system is disposed correspondingly at a high-risk leakage location in the water-cooling and heat-dissipation system, so as to guide the leakage liquid to a designated area for collecting the leakage liquid or/and detecting the leakage through a detection device.

BACKGROUND OF THE INVENTION

As the power of electronic device is constantly improved, the water-cooling and heat-dissipation system has become a widely used technology for high computing power device such as the personal computers and the data center. Although the heat dissipation efficiency of the water-cooling and heat-dissipation system is better than that of the air cooling system, there is also a risk of equipment damage due to the leakage of cooling liquid.

Usually, a water-cooling and heat-dissipation system includes a main circulation system and pipelines of various electronic devices, which can be connected to each other through male-and-female connectors or connecting hoses. In case of that the water-cooling and heat-dissipation system needs to be repaired or replaced, the leakage of cooling liquid may occur at the joints of male-and-female connectors or connecting hoses due to aging or improper operation, so that the electronic devices nearby the leakage is damaged and the risk of system failure is increased.

Therefore, there is a need of providing a leak-liquid guiding structure, which is disposed correspondingly at a high-risk leakage location in the water-cooling and heat-dissipation system, so as to guide the leakage liquid to a designated area for collecting the leakage liquid or/and detecting the leakage through a detection device. The drawbacks encountered by the prior arts are obviated.

SUMMARY OF THE INVENTION

An object of the present disclosure is to provide a leak-liquid guiding structure and a water-cooling and heat-dissipation system using the same. The leak-liquid guiding system is disposed correspondingly at a high-risk leakage location in the water-cooling and heat-dissipation system, so as to guide the leakage liquid to a designated area for collecting the leakage liquid or/and detecting the leakage through a detection device.

Another object of the present disclosure is to provide a leak-liquid guiding structure and a water-cooling and heat-dissipation system using the same. When a heat exchange device of the water-cooling and heat-dissipation system is utilized to dissipate the heat generated from electronic device, the heat exchange device and the electronic device need to be connected through a plurality of male-and-female connectors, so that the coolant flows between the heat exchange device and the electronic device through the plurality of male-and-female connectors. An inclined surface of the leak-liquid guiding structure is disposed correspondingly below each connection port of male-and-female connectors in the water-cooling and heat-dissipation system where coolant leakage may occur. When the coolant is leaked from the connection port of any one of the plurality of male-and-female connectors, a leakage liquid is formed and flows along the corresponding inclined surface to a lateral wall of the heat exchange device or a lateral wall of the electronic device, so that the leakage liquid is collected to a water collection device or/and flows through a leak-liquid detection for detecting the leakage. Thus, the leakage liquid of the water-cooling and heat-dissipation system is efficiently integrated and concentrated, and the configuration of the leak-liquid detection device is simplified.

A further object of the present disclosure is to provide a leak-liquid guiding structure and a water-cooling and heat-dissipation system using the same. For a connector component derived laterally from an installation surface in the water-cooling and heat-dissipation system, it allows connecting an inclined surface of the leak-liquid guiding to the installation surface to correspond to the joint component, so that the inclined surface is located below the corresponding connector component and configured to guide the leakage liquid overflowing from the connection port toward the installation surface or away from the installation surface by gravity. The leak-liquid guiding structure is fixed to the installation surface through a fastening element or a snap-in element. The inclined surface has for example a central section and two lateral sections, the central section is spatially corresponding to a lower edge of the connector component and laterally connected between the two lateral sections, and the central section is lower than the two lateral sections. Moreover, an end of the inclined surface away from the installation surface is higher than an end of the inclined surface adjacent to the installation surface, and a liquid collection opening is formed between the inclined surface of the leak-liquid guiding structure and the installation surface. With the arrangement, the leakage liquid is guided to the liquid collection opening through the inclined surface by gravity, and flows through the liquid collection opening. A leak-liquid detection device is further disposed correspondingly below the liquid collection opening. When the leakage liquid flows through the liquid collection opening, it allows to determine that the leakage liquid overflows from the connection port through the leak-liquid detection device. In addition, a water collection device is disposed correspondingly below the liquid collection opening, and the leakage liquid flowing through the liquid collection opening further flows along the installation surface by gravity, so as to be collected into the water collection device. In case of that a plurality of inclined surfaces spatially corresponding to a plurality of male-and-female connectors are arranged from top to bottom along the installation surface, it allows to set a water collection device at the bottom of the leak-liquid guiding structure or set a communication pipe for guiding from the liquid collection opening. In that, the leakage liquid is collected. On the other hand, it allows to combine the leak-liquid guiding structure with a plurality of inclined surfaces on a connection plate for being installed on the installation surface, so that the plurality of inclined surfaces are spatially corresponding to the connection ports of the plurality of male-and-female connectors arranged from top to bottom. The leak-liquid guiding structure is assembled to the connector component through the installation base and the guiding component, so as to be connected to the installation surface. The matching and the installation arrangement of the inclined surfaces of the leak-liquid guiding structure and the connection ports of connector components are adjustable according to the practical requirements.

In accordance with an aspect of the present disclosure, a water-cooling and heat-dissipation system is provided and includes a heat exchange device, an electronic device, a plurality of male-and-female connectors and a plurality of leak-liquid guiding structures. The heat exchange device is configured for cooling a coolant. The electronic device is configured for warming up the coolant. The plurality of male-and-female connectors are disposed between the heat exchange device and the electronic device, so that the coolant is allowed to flow between the heat exchange device and the electronic device through the plurality of male-and-female connectors. Each of the plurality of leak-liquid guiding structures is disposed below a corresponding one of the plurality of male-and-female connectors, and each of the plurality of leak-liquid guiding structures includes an inclined surface, wherein the inclined surface is introduced from a lateral wall of the heat exchange device or a lateral wall of the electronic device, and extended below a corresponding one of connection ports of the plurality of male-and-female connectors, wherein when the coolant is leaked from one of the connection ports of the plurality of male-and-female connectors, a leakage liquid is formed and flows along a corresponding one of the inclined surfaces to the lateral wall of the heat exchange device or the lateral wall of the electronic device.

In an embodiment, when the coolant flows to the electronic device through the plurality of male-and-female connectors, the coolant is heated up by the electronic device, wherein when the coolant flows to the heat exchange device through the plurality of male-and-female connectors, the coolant is cooled by the heat exchange device.

In an embodiment, after the leakage liquid flows along the corresponding one of the inclined surfaces to the lateral wall of the heat exchange device or the lateral wall of the electronic device, the leakage liquid is collected in a water-collection device, or/and flows through a leak-liquid detection device for detecting.

In accordance with another aspect of the present disclosure, a leak-liquid guiding structure is provided and configured to guide a leakage liquid leaked from a connection port. The connection port is formed by a connector component, the connector component is derived laterally from an installation surface, and the leak-liquid guiding structure includes an inclined. The inclined surface is connected to the installation surface, wherein the inclined surface is spatially corresponding to the connection port, located below the connection port, and configured to guide the leakage liquid overflowing from the connection port toward the installation surface or away from the installation surface by gravity.

In an embodiment, the connector component is connected between a heat exchange device and an electronic device, and includes a plurality of male-and-female connectors, and the installation surface is on a lateral wall of the heat exchange device or a lateral wall of the electronic device. The plurality of male-and-female connectors are arranged from top to bottom along the installation surface, the leak-liquid guiding structure includes a plurality of inclined surfaces, and each of the plurality of inclined surfaces is correspondingly disposed below each of the plurality of male-and-female connectors, wherein the plurality of inclined surfaces are disposed on a connection plate, and connected to the installation surface through the connection plate.

In an embodiment, the connection plate is fixed to the installation surface through a fastening element or a snap-in element.

In an embodiment, an end of the inclined surface away from the installation surface is higher than an end of the inclined surface adjacent to the installation surface.

In an embodiment, the inclined surface comprises a central section and two lateral sections, the central section is spatially corresponding to a lower edge of the connector component and laterally connected between the two lateral sections, and the central section is lower than the two lateral sections.

In an embodiment, the leak-liquid guiding structure further includes a liquid collection opening, wherein the liquid collection opening is disposed adjacent to the installation surface, and located below a joining position of the connector component and the installation surface, wherein the leakage liquid overflowing from the connection port is guided to the liquid collection opening through the inclined surface by gravity, and flows through the liquid collection opening.

In an embodiment, the leak-liquid guiding structure further includes a leak-liquid detection device disposed between the inclined surface and the installation surface and crossing below the liquid collection opening for detecting the leakage liquid when the leakage liquid flows through the liquid collection opening.

In an embodiment, the leak-liquid guiding structure further includes a water collection device disposed below the inclined surface, spatially corresponding to the liquid collection opening, and configured to collect the leakage liquid flowing through the liquid collection opening.

In an embodiment, the leak-liquid guiding structure further includes a water collection device located below the inclined surface; and a communication pipe connected between the liquid collection opening and the water collection device, and configured to guide the leakage liquid flowing through the liquid collection opening to the water collection device.

In accordance with another aspect of the present disclosure, a leak-liquid guiding structure is provided and configured to guide a leakage liquid leaked from a connection port. The connection port is formed by a connector component, the connector component is derived laterally from an installation surface, and the leak-liquid guiding structure includes an installation base and a guiding component. The installation base is disposed on the installation surface and connected to the connector component. The guiding component is connected to the installation base, wherein guiding component includes an upper liquid collection opening and an inclined surface, the upper liquid collection opening is disposed between installation base and the guiding component, and located below the connector component, and the inclined surface is spatially corresponding to the connection port, located below the connection port, and configured to guide the leakage liquid overflowing from the connection port to flow through the upper liquid collection opening, wherein the installation base includes a lower liquid collection opening in fluid communication with the upper liquid collection opening, and configured to guide the leakage liquid flowing through the upper liquid collection opening to flow through the lower liquid collection opening by gravity.

In an embodiment, the installation base further includes a flow guide channel in fluid communication between the upper liquid collection opening and the lower liquid collection opening, and configured to guide the leakage liquid flowing through the upper liquid collection opening to flow through the lower liquid collection opening by gravity.

In an embodiment, the leak-liquid guiding structure further includes a leak-liquid detection device disposed between the inclined surface and the installation surface and crossing below the lower liquid collection opening for detecting the leakage liquid when the leakage liquid flows through the lower liquid collection opening.

In an embodiment, an end of the inclined surface away from the installation surface is higher than an end of the inclined surface adjacent to the installation surface.

In an embodiment, the inclined surface includes a central section and two lateral sections, the central section is spatially corresponding to a lower edge of the connector component and laterally connected between the two lateral sections, and the central section is lower than the two lateral sections.

In an embodiment, the connector component includes two connector components arranged up and down on the installation surface, and the installation base includes an upper mounting notch and a lower mounting notch connected to the two connector components, respectively.

In an embodiment, each of the two connector components includes a fixed connector and a jointing connector connected to each other through mating, so as to clamp a corresponding one of the upper mounting notch or the lower mounting notch and fix the installation base to the installation surface, wherein the upper mounting notch and the lower mounting notch face in opposite directions.

In an embodiment, the installation base and the guiding component include a first engaging element and a second engaging element, respectively, and the first engaging element and the second engaging element are paired and engaged with each other for fixing the guiding component to the installation base.

In an embodiment, the connector component is connected to a pipeline to form the connection port.

In an embodiment, the installation surface is perpendicular to a ground.

In an embodiment, the inclined surface shields the connection port in a viewing direction from bottom to top.

BRIEF DESCRIPTION OF THE DRAWINGS

The above contents of the present disclosure will become more readily apparent to those ordinarily skilled in the art after reviewing the following detailed description and accompanying drawings, in which.

DETAILED DESCRIPTION OF THE PREFERRED EMBODIMENT

Figure 1:
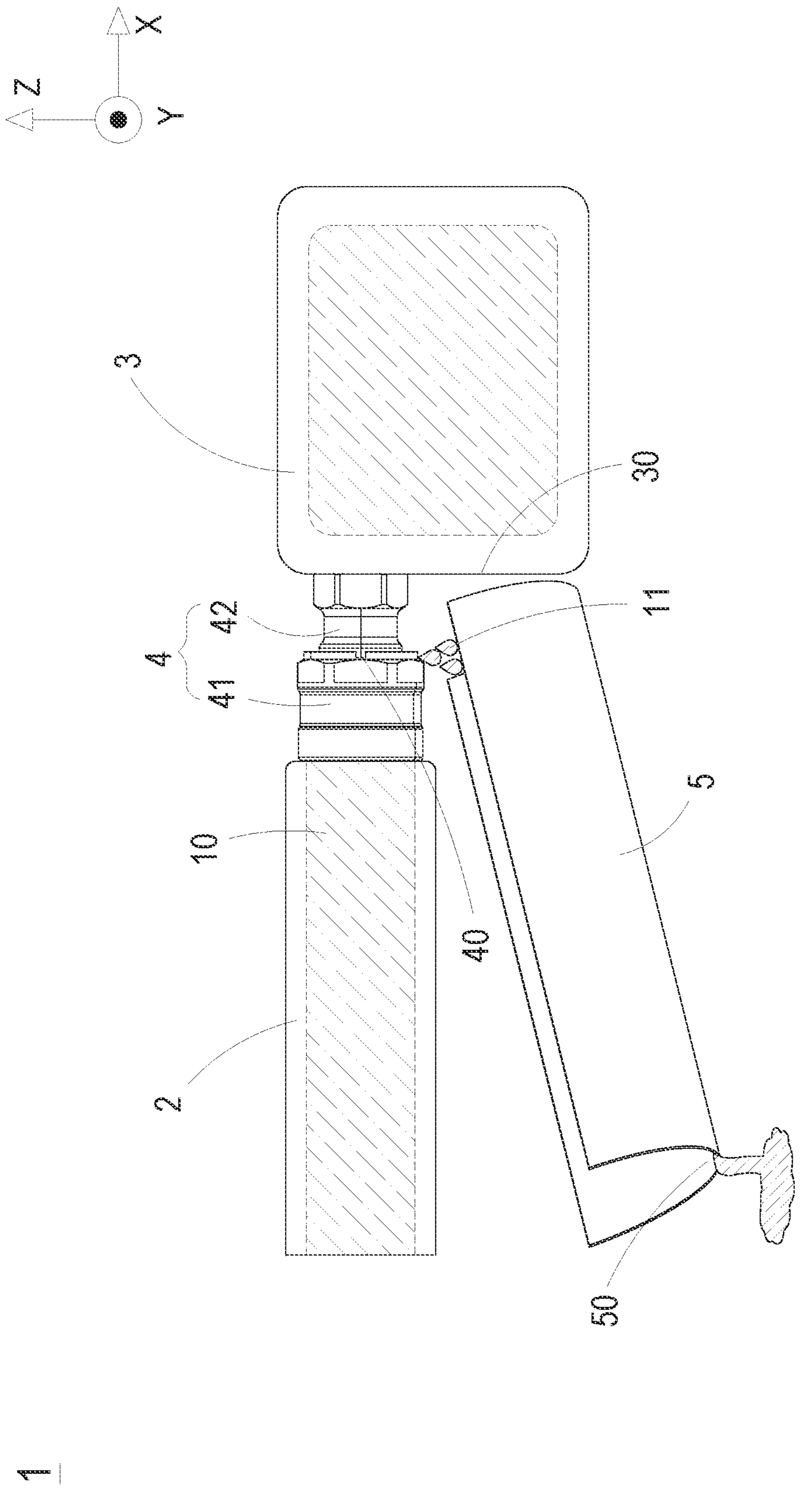
FIG. 1 is a schematic structural diagram illustrating a water-cooling and heat-dissipation system according to a first embodiment of the present disclosure.

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "top," "bottom," "upper," "lower," "below" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. When an element is referred to as being "connected," or "coupled," to another element, it can be directly connected or coupled to the other element or intervening elements may be present. Although the wide numerical ranges and parameters of the present disclosure are approximations, numerical values are set forth in the specific examples as precisely as possible. In addition, although the "first," "second," "third," and the like terms in the claims be used to describe the various elements can be appreciated, these elements should not be limited by these terms, and these elements are described in the respective embodiments are used to express the different reference numerals, these terms are only used to distinguish one element from another element. For example, a first element could be termed a second element, and, similarly, a second element could be termed a first element, without departing from the scope of example embodiments.

FIG. 1 is a schematic structural diagram illustrating a water-cooling and heat-dissipation system according to a first embodiment of the present disclosure. In the embodiment, the water-cooling and heat-dissipation system 1 includes a heat exchange device 2, an electronic device 3, a connector component 4 and a leak-liquid guiding structure 5. The heat exchange device 2 is configured for cooling a coolant 10 circulating in the water-cooling and heat-dissipation system 1. The electronic device 3 is configured for warming up the coolant 10, so as to dissipate the heat generated therefrom. In order to allow the coolant 10 in the heat exchange device 2 to flow to the electronic device 3, the heat exchange device 2 and the electronic device 3 need to be connected through at least one connector component 4. When the coolant 10 flows to the electronic device 3 through the at least one connector component 4, the coolant 10 is heated up by the electronic device 3. When the coolant 10 flows to the heat exchange device 2 through the at least one connector component 4, the coolant 10 is cooled by the heat exchange device 10. Preferably but not exclusively, in the embodiment, the connector component 4 is a male-and-female connector formed by pairing a male connector 41 and a female connector 42. The connection between the heat exchange device 2 and the electronic device 3 is not limited to a single connector component 4. The heat exchange device 2 and the electronic device 3 are not limited to one-to-one communication. In other embodiments, a plurality of connector components 4 are disposed between the heat exchange device 2 and the electronic device 3, so that the coolant 10 is allowed to flow between the heat exchange device 2 and the electronic device 3 through the plurality of connector components 4, and the circulation of the coolant 10 in the water-cooling and heat-dissipation system 1 is achieved. In the embodiment, the number of leak-liquid guiding structures 5 corresponds to the number of connector components 4, and each leak-liquid guiding structure 5 is correspondingly disposed below one of the connector components 4. In the embodiment, each of the plurality of leak-liquid guiding structures 5 includes an inclined surface 50. The inclined surface 50 is introduced from a lateral wall 30 of the electronic device 3, and extended below a corresponding one of connection ports 40 of the male connector 41 and the female connectors 42. Preferably but not exclusively, the inclined surface 50 is inclined from the electronic device 3 toward the heat exchange device 2 and is lowered in level. When the coolant 10 is leaked from one of the connection ports 40 of the male connectors 41 and the female connectors 42 in the water-cooling and heat-dissipation system 1, the leaked coolant 10 forms a leakage liquid 11 and flows along a corresponding one of the inclined surfaces 50 to the heat exchange device 2 by gravity, so as to facilitate the collection.

Figure 2:
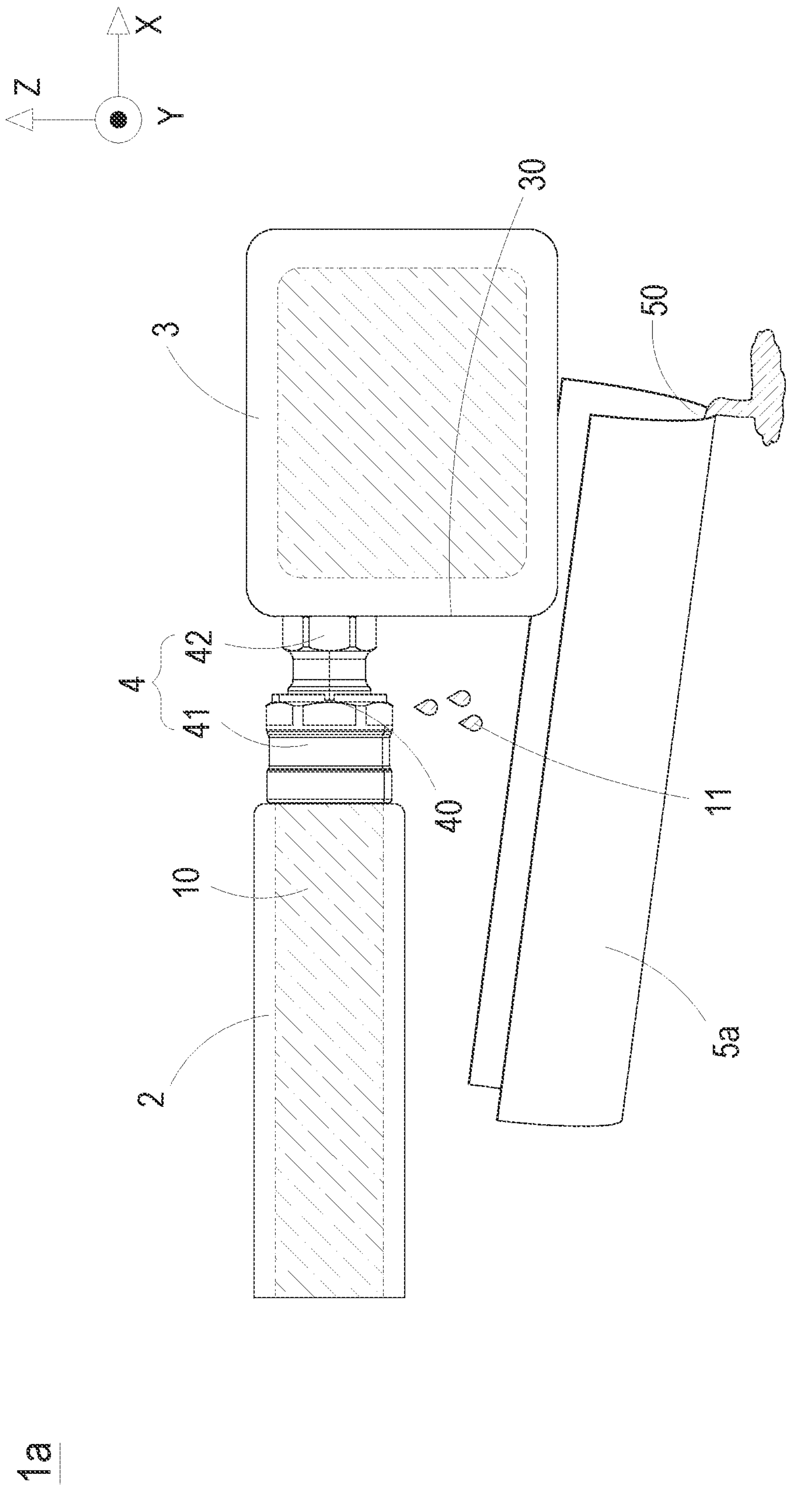
FIG. 2 is a schematic structural diagram illustrating a water-cooling and heat-dissipation system according to a second embodiment of the present disclosure.
Figure 3:
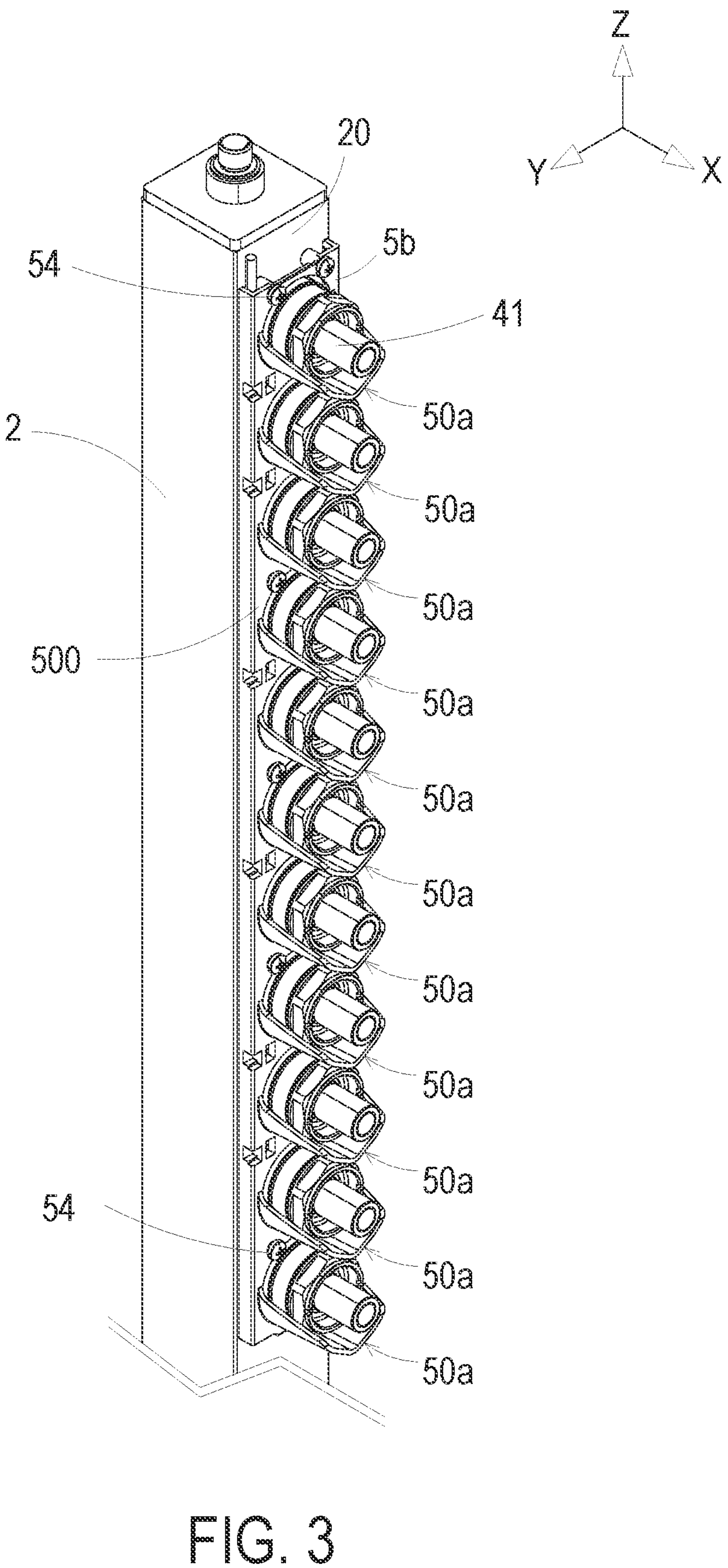
FIG. 3 is a perspective view illustrating an assembly structure of a leak-liquid guiding structure and a heat exchange device of a water-cooling and heat-dissipation system according to a third embodiment of the present disclosure.
Figure 4:
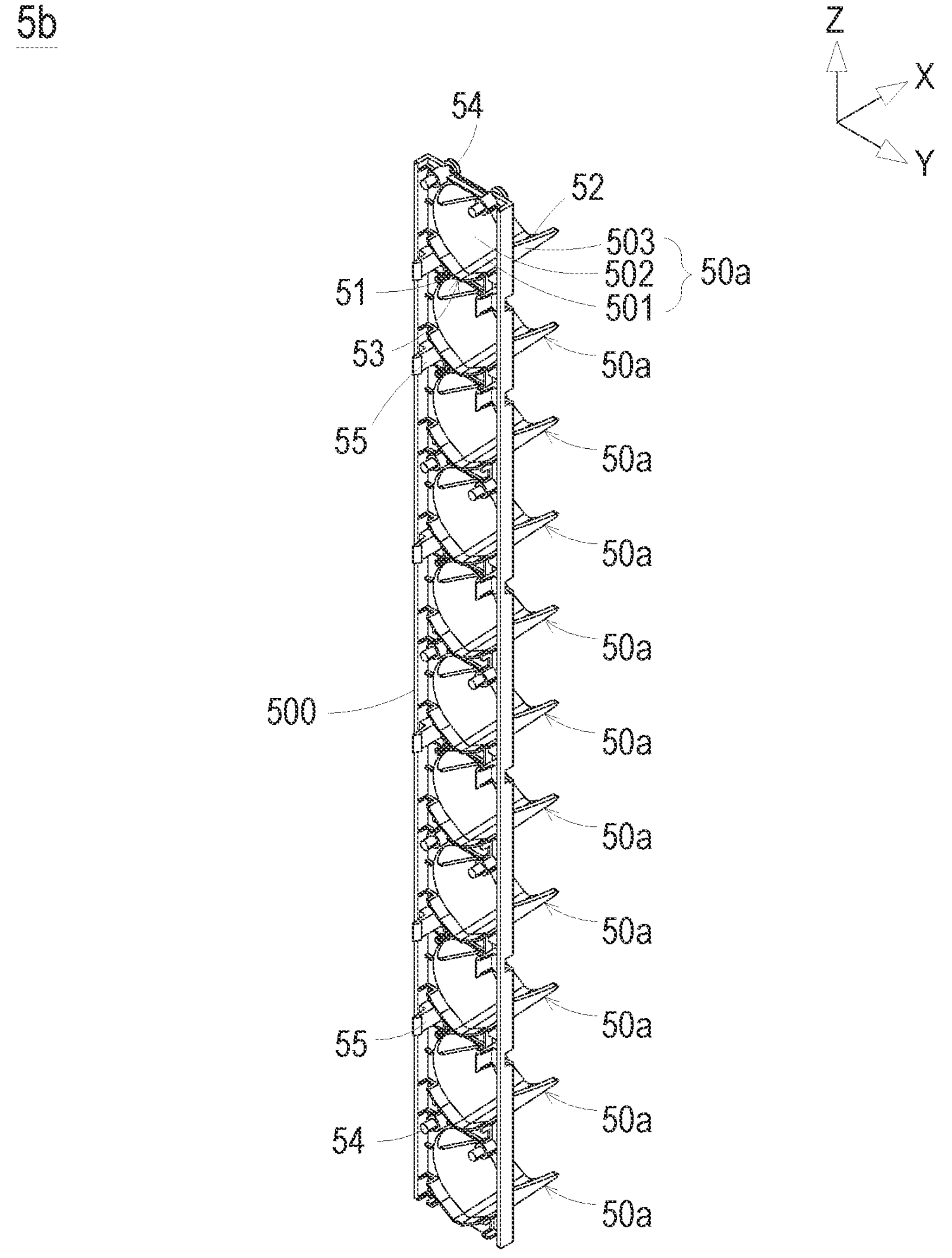
FIG. 4 is a perspective view illustrating the leak-liquid guiding structure of the water-cooling and heat-dissipation system according to the third embodiment of the present disclosure.
Figure 5:
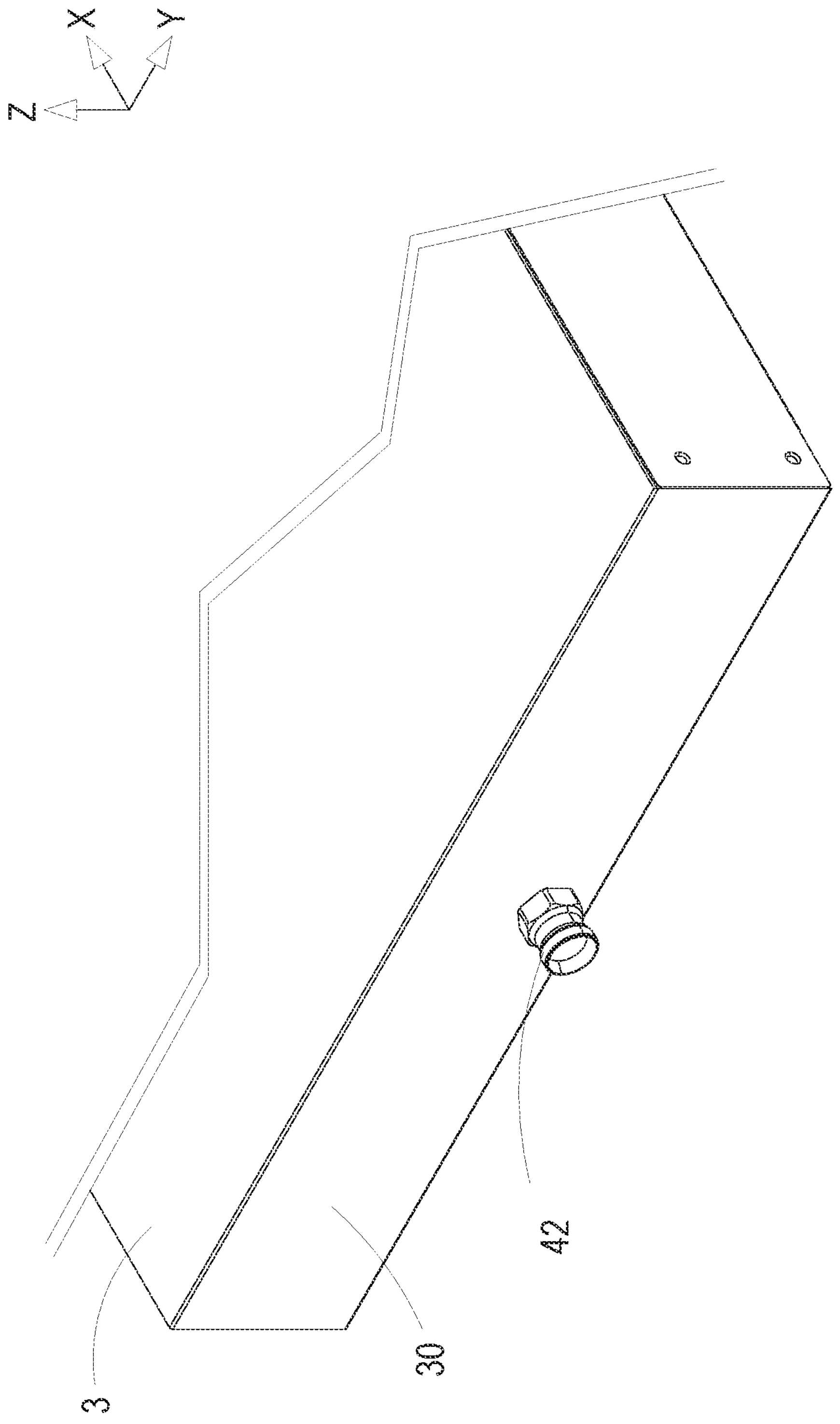
FIG. 5 is a perspective view illustrating the electronic device of the water-cooling and heat-dissipation system according to the third embodiment of the present disclosure.
Figure 6:
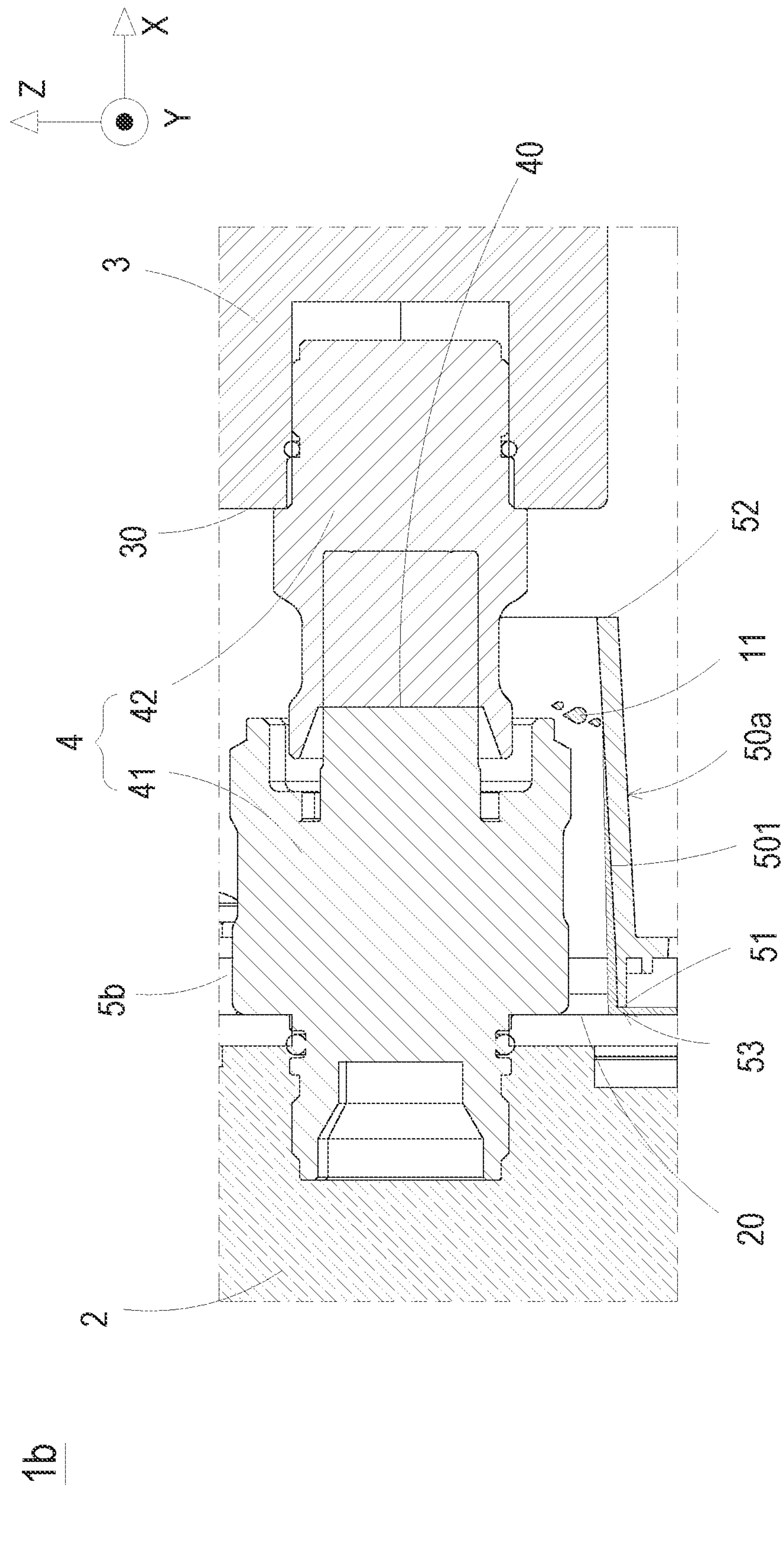
FIG. 6 is a cross-sectional view illustrating the water-cooling and heat-dissipation system according to the third embodiment of the present disclosure.

FIG. 2 is a schematic structural diagram illustrating a water-cooling and heat-dissipation system according to a second embodiment of the present disclosure. In the embodiment, the structures, elements and functions of the water-cooling and heat-dissipation system 1*a* are similar to those of the water-cooling and heat-dissipation system 1 of FIG. 1, and are not redundantly described herein. In the embodiment, the inclined surface 50 of the leak-liquid guiding structure 5*a* is inclined from the heat exchange device 2 toward the electronic device 3 and is lowered in level. When the coolant 10 is leaked from one of the connection ports 40 of the male connectors 41 and the female connectors 42 in the water-cooling and heat-dissipation system 1*a*, the leaked coolant 10 forms a leakage liquid 11 and flows along a corresponding one of the inclined surfaces 50 to the electronic device 3 by gravity, so as to facilitate the collection.

Notably, in the above embodiments, the inclined direction of the inclined surface 50 relative to the heat exchange device 2 and the electronic device 3 is adjustable according to the practical requirements. Preferably but not exclusively, the inclined surface 50 is introduced from a lateral wall of the heat exchange device 2 or a lateral wall 30 of the electronic device 3, and extended below a corresponding one of connection ports 40 of the connector components 4. When the coolant 10 is leaked from anyone of the connection ports 40 of the male connectors 41 and the female connectors 42, the leakage liquid 11 flows along a corresponding one of the inclined surfaces 50 to the lateral wall of the heat exchange device 2 or the lateral wall 30 of the electronic device 3 by gravity for further collection or detection. The detailed operations are described later.

FIG. 3 to FIG. 6 illustrate a water-cooling and heat-dissipation system according to a third embodiment of the present disclosure. In the embodiment, the structures, elements and functions of the water-cooling and heat-dissipation system 1*b* are similar to those of the water-cooling and heat-dissipation system 1, la of FIG. 1 and FIG. 2, and are not redundantly described herein. Preferably but not exclusively, in the embodiment, the heat exchange device 2 of the water-cooling and heat-dissipation system 1*b* is connected to a plurality of electronic devices 3 through a plurality of connector components 4. In other embodiments, the heat exchange device 2 and the electronic device 3 are connected a single connector component 4, but the present disclosure is not limited thereto. In the embodiment, the connector components 4 are connected between the heat exchange devices 2 and the electronic devices 3 and include a plurality of male connectors 41 and female connectors 42 in pairs. In the embodiment, a lateral side of the heat exchange device 2 is served as the installation surface 20 for illustration, and the present disclosure is not limited thereto. In other embodiments, the lateral side 30 of the electronic device 3 is served as an installation surface, and the present disclosure is not limited thereto. Preferably but not exclusively, in the embodiment, the installation surface 20 is perpendicular to the ground. The plurality of male connectors 41 of the connector components 4 are arranged from top to bottom along the installation surface (i.e., the Z axial direction). Each male connector 41 of the connector components 4 is laterally derived from the installation surface 20, and in fluid communication along the X axial direction. In the embodiment, the leak-liquid guiding structure 5*b* includes a plurality of inclined surface 50*a*, and each of the plurality of inclined surface 50*a* is correspondingly disposed below one of the connection ports 40 of the male connectors 41 and the female connectors 42 in pairs. Moreover, the plurality of inclined surface 50*a* are disposed on a connection plate 500, and connected to the installation surface 20 through the connection plate 500. Preferably but not exclusively, in the embodiment, the connection plate 500 is fixed to the installation surface 20 through a fastening element 54 or a snap-in element 55. Notably, as the connection plate 500 is fixed to the installation surface 20, each of the inclined surfaces 50*a* of the leak-liquid guiding structure 5*b* is spatially corresponding to the connection port 40 formed by the corresponding connector component 4, and located below the corresponding connector component 4. In the embodiment, an outer end 52 of each inclined surface 50*a* away from the installation surface 20 is higher than an inner end 51 of each inclined surface 50*a* adjacent to the installation surface 20. In addition, each inclined surface 50*a* includes a central section 501 and two lateral sections 502, 503, the central section 501 is spatially corresponding to a lower edge of the corresponding connector component 4 and laterally connected between the two lateral sections 502, 503, and the central section 501 is lower than the two lateral sections 502, 503. When the leakage liquid 11 overflows from anyone of the connection ports 40, the leakage liquid 11 is guided to flow along the inclined surface 50*a* toward the installation surface 20 on the heat exchange device 2 by gravity. Certainly, in other embodiments, the leakage liquid 11 is guided to flow toward the electronic device 3 by changing the inclined direction or the installation position of the inclined surface 50*a*. That is, the leakage liquid 11 is guided away from the installation surface 20 on the heat exchange device 2. The present disclosure is not limited thereto.

In the embodiment, the leak-liquid guiding structure 5*b* further includes a liquid collection opening 53. The liquid collection opening 53 is disposed adjacent to the installation surface 20, and located below a joining position of the connector component 4 and the installation surface 20. In the embodiment, the leakage liquid 11 overflowing from the connection port 40 is guided to the liquid collection opening 53 through the inclined surface 50*a* by gravity, and flows through the liquid collection opening 53 for further collection and detection.

Figure 7:
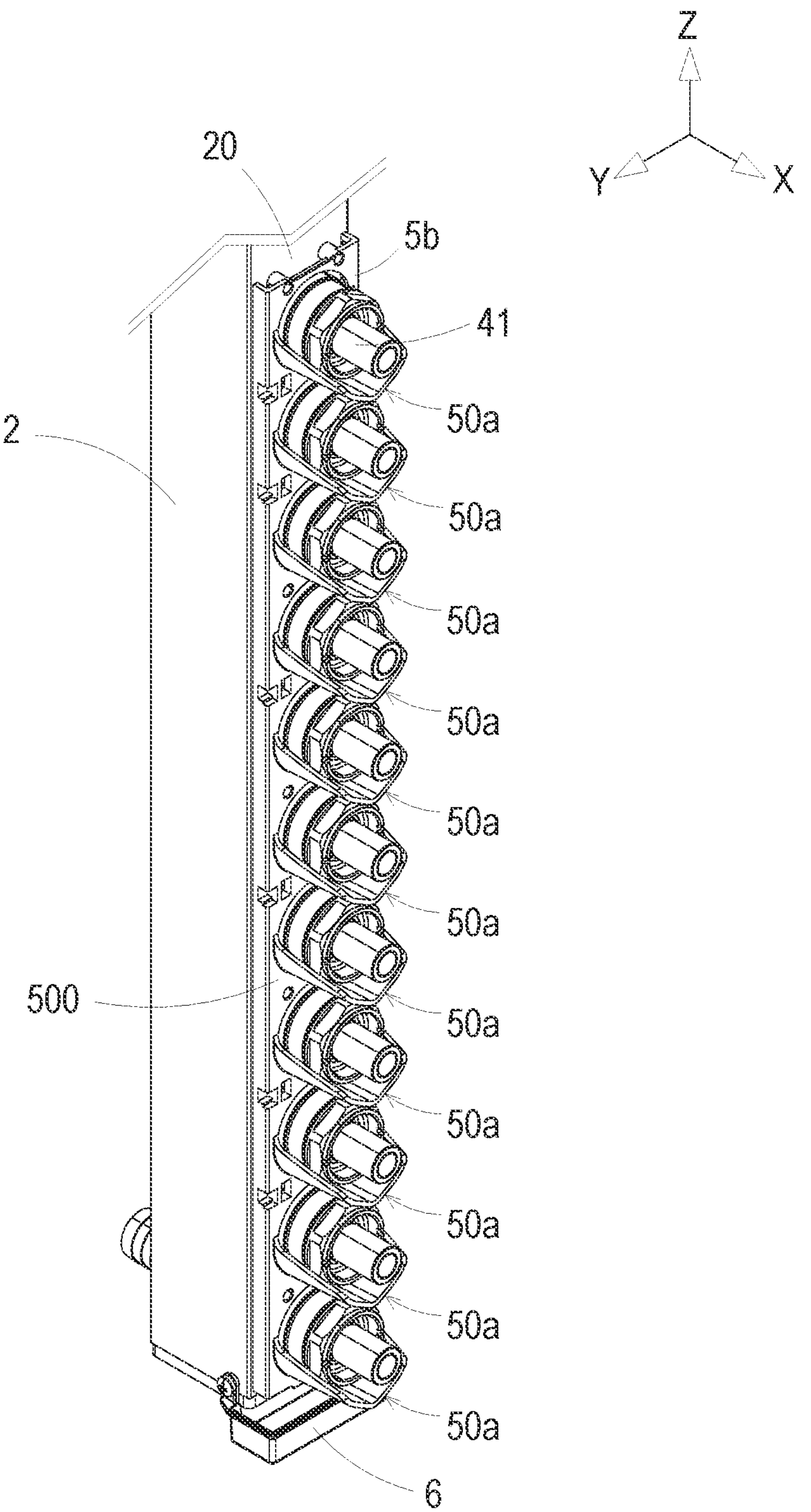
FIG. 7 is a perspective view illustrating an assembly structure of a leak-liquid guiding structure and a heat exchange device of a water-cooling and heat-dissipation system according to a fourth embodiment of the present disclosure.
Figure 8:
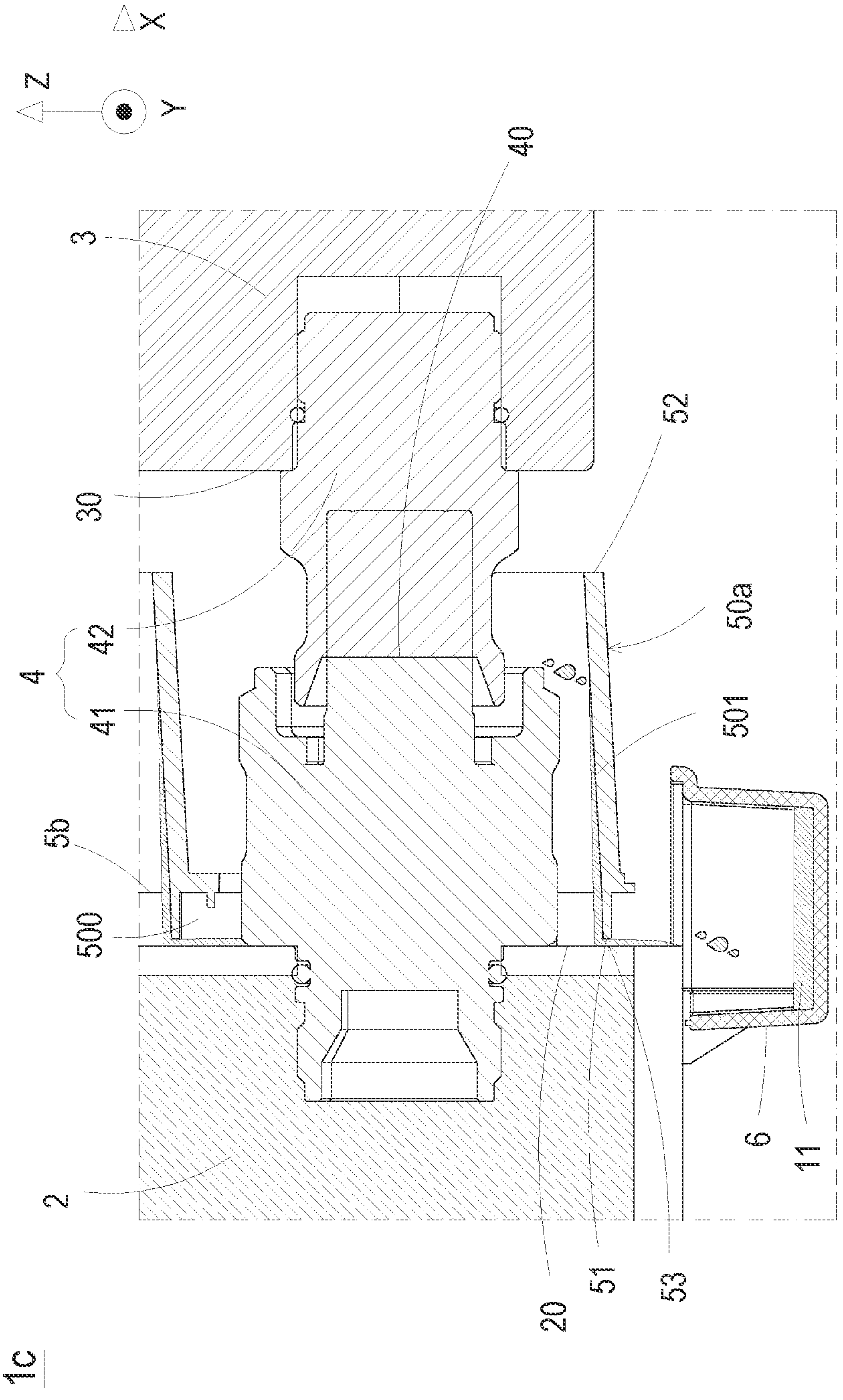
FIG. 8 is a cross-sectional view illustrating the water-cooling and heat-dissipation system according to the fourth embodiment of the present disclosure.

FIG. 7 and FIG. 8 illustrate a water-cooling and heat-dissipation system according to a fourth embodiment of the present disclosure. In the embodiment, the structures, elements and functions of the water-cooling and heat-dissipation system 1*c* are similar to those of the water-cooling and heat-dissipation system 1, 1*a*, 1*b* of FIG. 1 to FIG. 6, and are not redundantly described herein. In the embodiment, the heat exchange device 2 of the water-cooling and heat-dissipation system 1*c* is connected to a plurality of electronic devices 3 through a plurality of connector components 4. The male connectors 41 of the connector components 4 are arranged from top to bottom along the installation surface 20 (i.e., the Z axial direction), and the installation surface 20 is perpendicular to the ground. Each male connector 41 of the connector components 4 is laterally derived from the installation surface 20, and in fluid communication along the X axial direction. In the embodiment, the leak-liquid guiding structure 5*b* includes a plurality of inclined surface 50*a*, and each of the plurality of inclined surface 50*a* is correspondingly disposed below one of the connection ports 40 of the male connectors 41 and the female connectors 42 in pairs. Moreover, each inclined surface 50*a* includes a liquid collection opening 53 disposed adjacent to the installation surface 20, and located below a joining position of the connector component 4 and the installation surface 20. Each inclined surface 50*a* shields the corresponding connection port 40 in a viewing direction (i.e., the Z axial direction) from bottom to top. In the embodiment, the leak-liquid guiding structure 5*b* further includes a water collection device 6 disposed the bottom of the plurality of inclined surfaces 50*a*, spatially corresponding to the liquid collection opening 53 arranged above, and configured to collect the leakage liquid 11 flowing through the liquid collection opening 53. In the embodiment, the leakage liquid 11 collected from the upper inclined surface 50*a* and flowing through the liquid collection opening 53 is allowed to flow along the installation surface 20 and then through the lower liquid collection opening 53. Finally, the leakage liquid 11 is collected in the water collection device 6. Certainly, the present disclosure is not limited thereto.

Figure 9:
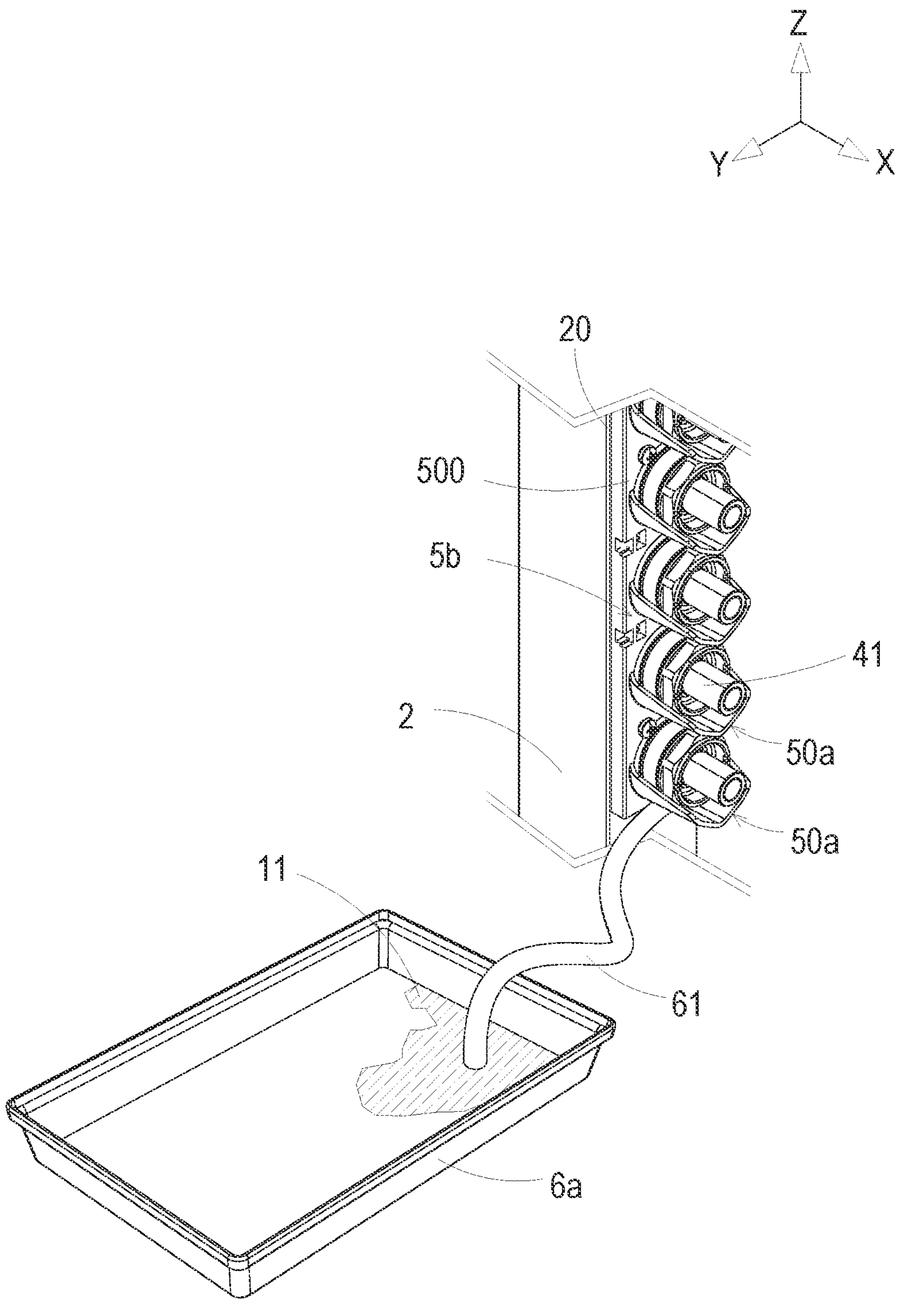
FIG. 9 is a perspective view illustrating an assembly structure of a leak-liquid guiding structure and a heat exchange device of the water-cooling and heat-dissipation system according to a fifth embodiment of the present disclosure.

FIG. 9 illustrates an assembly structure of a leak-liquid guiding structure and a heat exchange device of the water-cooling and heat-dissipation system according to a fifth embodiment of the present disclosure. In the embodiment, the structures, elements and functions of the leak-liquid guiding structure 5*b* are similar to those of the leak-liquid guiding structure 5*b* of FIG. 7 to FIG. 8, and are not redundantly described herein. In the embodiment, the leak-liquid guiding structure 5*b* further includes a water collection device 6*a* and a communication pipe 61. The water collection device 6*a* is located below the plurality of inclined surfaces 50*a*, and has a horizontal height lower than the lowermost liquid collection opening 53. The communication pipe 61 is connected between the lowermost liquid collection opening 53 and the water collection device 6*a*, and configured to guide the leakage liquid 11 flowing through the lowermost liquid collection opening 53 to the water collection device 6*a*. Certainly, the arrangements of the water collection device 6*a* and the communication pipe 61 corresponding to the liquid collection opening 53 are adjustable according to the practical requirements, and the present disclosure is not limited thereto.

Figure 10:
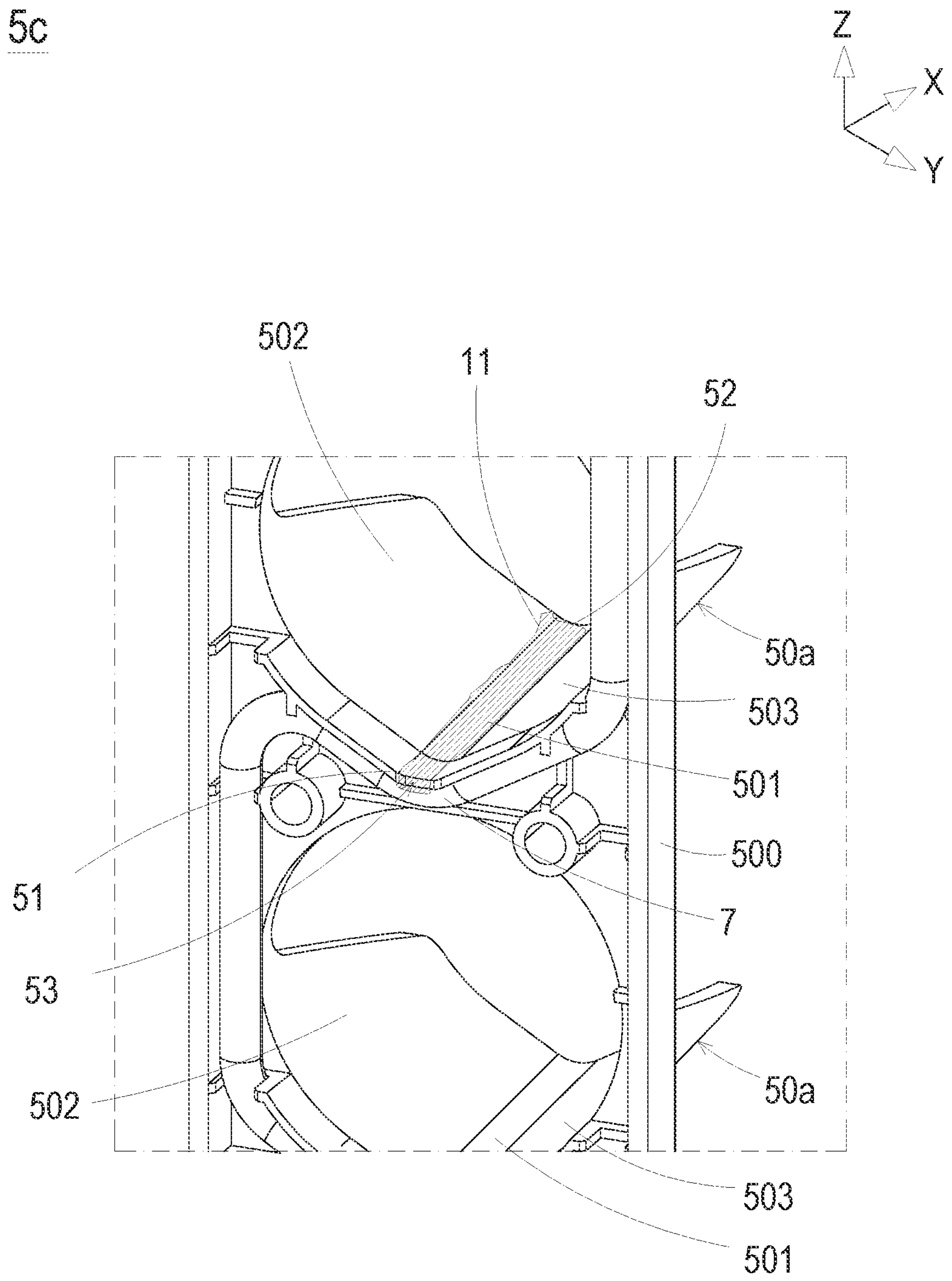
FIG. 10 is a perspective view illustrating a leak-liquid guiding structure of a water-cooling and heat-dissipation system according to a sixth embodiment of the present disclosure.
Figure 11:
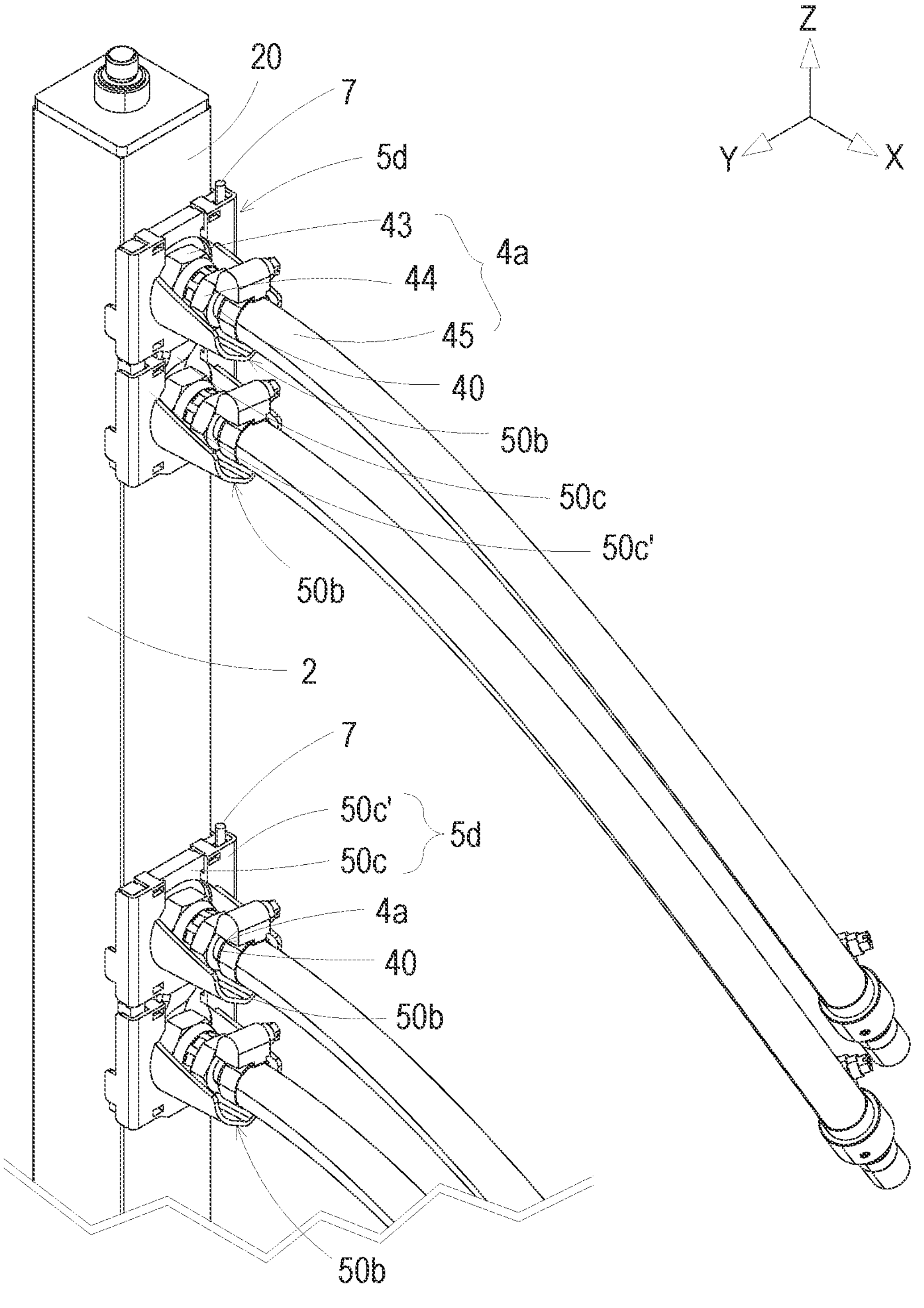
FIG. 11 is a perspective view illustrating a water-cooling and heat-dissipation system according to a seventh embodiment of the present disclosure.
Figure 12:
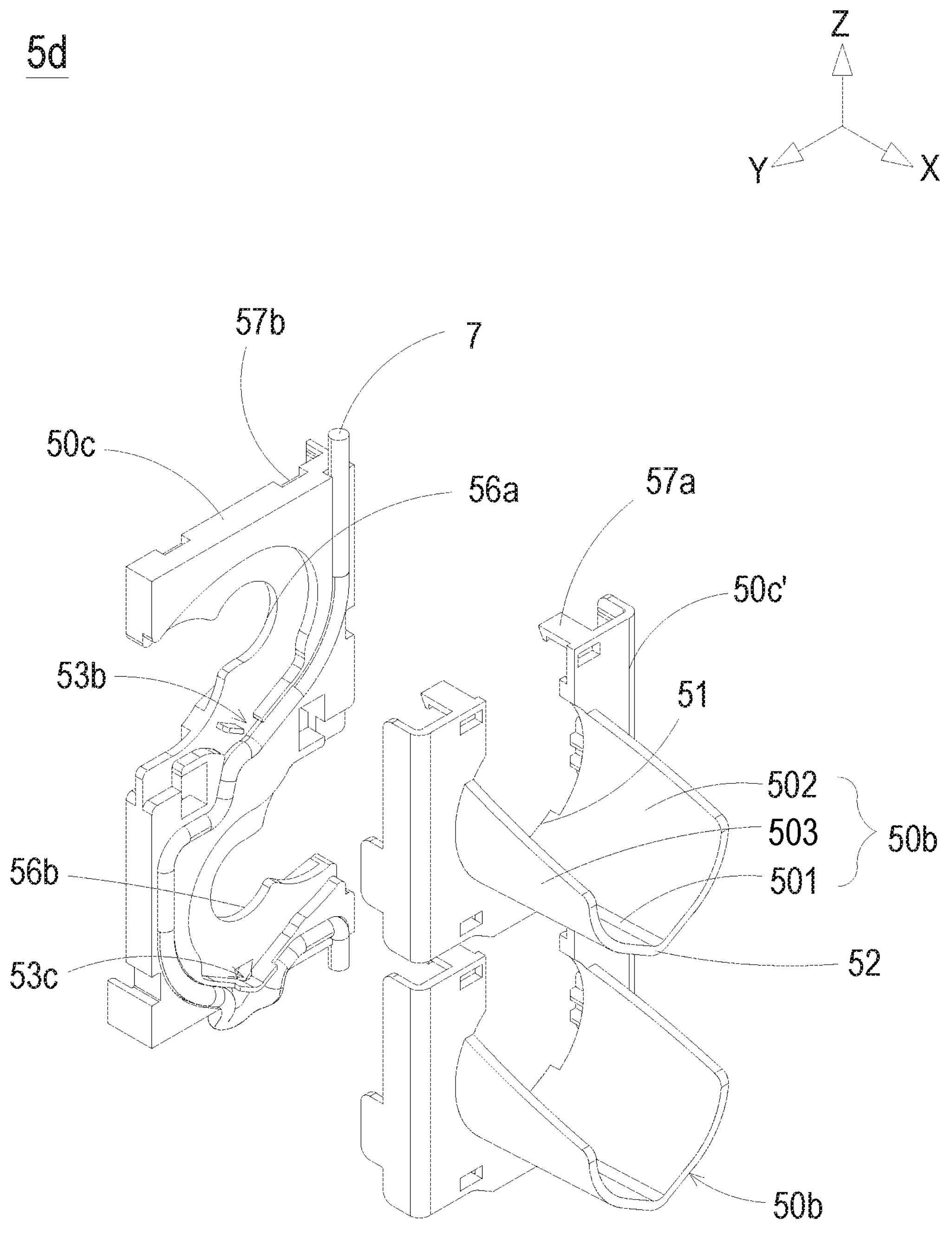
FIG. 12 is an exploded view illustrating the leak-liquid guiding structure of the water-cooling and heat-dissipation system according to the seventh embodiment of the present disclosure.
Figure 13:
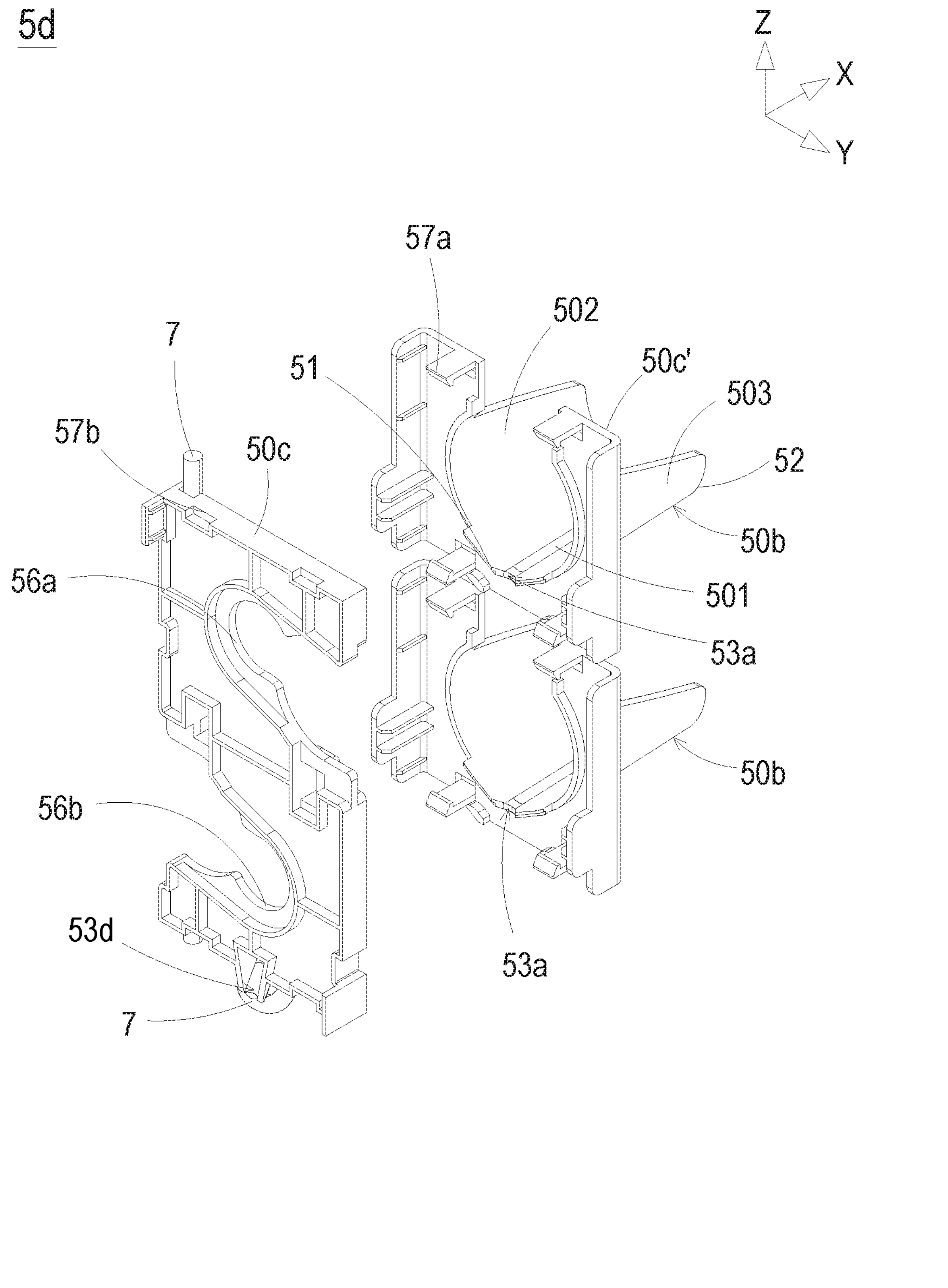
FIG. 13 is an exploded view illustrating the leak-liquid guiding structure of the water-cooling and heat-dissipation system according to the seventh embodiment of the present disclosure from another perspective.
Figure 14:
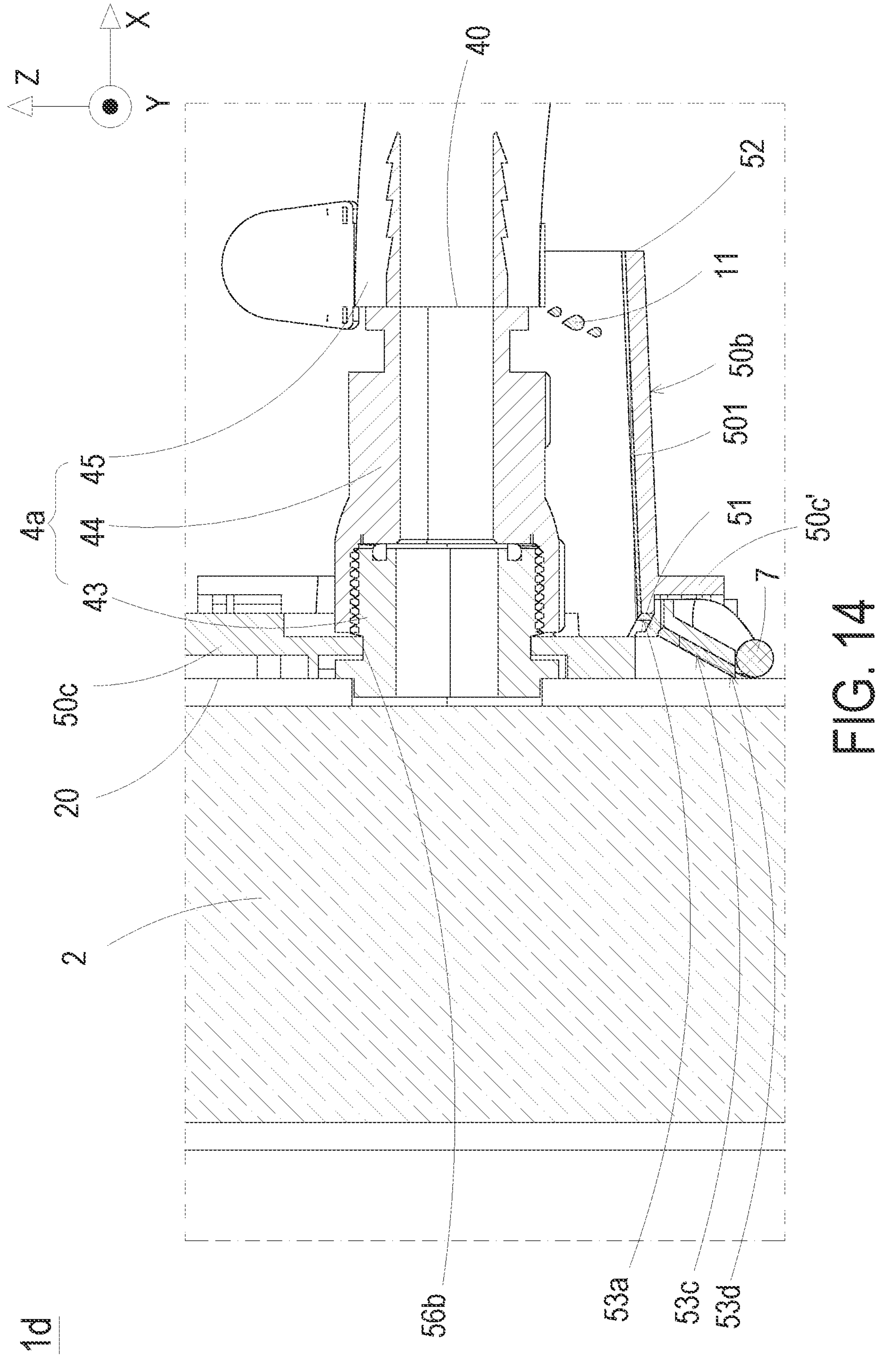
FIG. 14 is a cross-sectional view illustrating the water-cooling and heat-dissipation system according to the seventh embodiment of the present disclosure.

FIG. 10 illustrates a leak-liquid guiding structure of the water-cooling and heat-dissipation system according to a sixth embodiment of the present disclosure. In the embodiment, the structures, elements and functions of the leak-liquid guiding structure 5*c* are similar to those of the leak-liquid guiding structure 5*b* of FIG. 7 to FIG. 9, and are not redundantly described herein. In the embodiment, the leak-liquid guiding structure 5*c* further includes a leak-liquid detection device 7. Preferably but not exclusively, the leak-liquid detection device 7 is arranged meanderingly in a linear shape between the leak-liquid guiding structure 5*c* and the installation surface 20, crosses between each inclined surface 50*a* and the installation surface 20, and located below each liquid collection opening 53. When the leakage liquid 11 is guided to the liquid collection opening 53 along the inclined surface 50*a* by gravity and flows through the liquid collection opening 53, the leakage liquid 11 is detected by the leak-liquid detection device 7. In other embodiments, the configuration of the leak-liquid detection device 7 corresponding to the plurality of liquid collection openings 53 is adjustable according to the practical requirements, and the present disclosure is not limited thereto.

FIG. 11 to FIG. 14 illustrate a water-cooling and heat-dissipation system according to a seventh embodiment of the present disclosure. In the embodiment, the structures, elements and functions of the water-cooling and heat-dissipation system 1*d* are similar to those of the water-cooling and heat-dissipation system 1, 1*a*, 1*b*, 1*c* of FIG. 1 to FIG. 8, and are not redundantly described herein. Preferably but not exclusively, in the embodiment, the heat exchange device 2 is in fluid communication with a plurality of pipelines through a plurality of connector components 4*a*. Two connector components 4*a* are further arranged up and down on the installation surface 20. In the embodiment, the two connector components 4*a* of the leak-liquid guiding structure 5*d* are taken as one set for describing the actions of guiding the leakage liquid 11 overflowing from the connection ports 40, but the present disclosure is not limited thereto. Corresponding to the connection ports 40 of the two connector components 4*a* arranged in one set, the leak-liquid guiding structure 5*d* includes an installation base 50*c* and two guiding components 40*c*. The installation base 50*c* is disposed on the installation surface 20 and connected to the connector components 4*a*. In the embodiment, there are two connector components 4*a* arranged up and down on the installation surface 20, and the installation base 50*c* includes an upper mounting notch 56*a* and a lower mounting notch 56*b* connected to the two connector components 4*a*, respectively. Each of the two connector components 4*a* includes a fixed connector 43 and a jointing connector 44 connected to each other through mating, so as to clamp a corresponding one of the upper mounting notch 56*a* or the lower mounting notch 56*b* and fix the installation base 50*c* to the installation surface 20. Preferably but not exclusively, in other embodiments, the installation base 50*c* is directly fastened or snapped onto the installation surface 20. In the embodiment, each jointing connector 44 is further connected to a pipeline 45 to form a connection port 40. Certainly, the mating joint between the fixed connector 43 and the jointing connector 44 can also be regarded as a connection port, and the present disclosure is not limited thereto. In the embodiment, the guiding component 50*c*' and the installation base 50*c* further include a first engaging element 57*a* and a second engaging element 57*b*, respectively, and the first engaging element 57*a* and the second engaging element 57*b* are paired and engaged with each other for fixing the two guiding components 50*c* to the installation base 50*c*. Certainly, the manner of fixing the guiding components 50*c*' to the installation base 50*c* and the numbers of the guiding components 50*c*, and the installation base 50*c* are not limited thereto. In other embodiments, the number and the size of the installation bases 50*c* for mating the guiding components 50*c*', and the arrangement corresponding to the connector components 4*a* are adjustable according to the practical requirements, and the present disclosure is not limited thereto. In the embodiment, each guiding component 50*c*' includes an upper liquid collection opening 53*a* and an inclined surface 50*b*. The upper liquid collection opening 53*a* is disposed between the guiding component 50*c*' and the installation base 50*c*, and located below a joining position of the corresponding connector component 4*a* and the installation base 50*c*. The inclined surface 50*b* is spatially corresponding to the connection port 40, and located below the corresponding connector component 4*a*. In the embodiment, an outer end 52 of each inclined surface 50*b* away from the installation surface 20 is higher than an inner end 51 of each inclined surface 50*b* adjacent to the installation surface 20. In addition, each inclined surface 50*b* includes a central section 501 and two lateral sections 502, 503, the central section 501 is spatially corresponding to a lower edge of the corresponding connector component 4*a* and laterally connected between the two lateral sections 502, 503, and the central section 501 is lower than the two lateral sections 502, 503. When the leakage liquid 11 overflows from anyone of the connection ports 40, the leakage liquid 11 is guided by gravity to flow along the inclined surface 50*b* toward the upper liquid collection opening 53*a*, and then through the upper liquid collection opening 53*a*. In the embodiment, the installation base 50*c* further includes a lower liquid collection opening 53*b*. Preferably but not exclusively, the lower liquid collection opening 53*b* is disposed between the installation base 50*c* and the upper guiding component 50*c*' and in fluid communication with the upper liquid collection opening 53*a*. In the embodiment, the lower liquid collection opening 53*b* is configured to guide the leakage liquid 11 flowing through the upper liquid collection opening 53*a* to flow through the lower liquid collection opening 53*b* by gravity. In the embodiment, the installation base 50*c* also includes a flow guide channel 53*c* and a lower liquid collection opening 53*d*. The lower liquid collection opening 53*d* is disposed between the installation base 50*c* and the installation surface 20. Preferably but not exclusively, the flow guide channel 53*c* is disposed between the installation base 50*c* and the inclined surface 50*b*, and in fluid communication between the upper liquid collection opening 53*a* and the lower liquid collection opening 53*d*. In the embodiment, the flow guide channel 53*c* is configured to guide the leakage liquid 11 flowing through the upper liquid collection opening 53*a* by gravity to flow to the lower liquid collection opening 53*d* and then through the lower liquid collection opening 53*d*.

In the embodiment, the leak-liquid guiding structure 5*d* further includes a leak-liquid detection device 7. Preferably but not exclusively, the leak-liquid detection device 7 is arranged meanderingly in a linear shape between the installation base 50*c* and the guiding component 50*c*, and crosses below each lower liquid collection opening 53*b*, 53*d*. When the leakage liquid 11 is guided to flow through the lower liquid collection opening 53 *b*, 53*d*, the leakage liquid 11 is detected by the leak-liquid detection device 7. Certainly, the configuration of the leak-liquid detection device 7 corresponding to the lower liquid collection opening 53*b*, 53*d* is adjustable according to the practical requirements. The present disclosure is not limited thereto, and not redundantly described hereafter.

From the above, in the foregoing embodiments, by disposing the inclined surface 50, 50*a*, 50*b* corresponding to the connection port 40 formed in each connector component 4, 4*a*, when the leakage liquid 11 overflows from anyone of the connection ports 40, the leakage liquid 11 is guided to flow along the inclined surface 50, 50*a*, 50*b* to a designated area for collecting the water or detecting the leakage through a detection device. Preferably but not exclusively, the leakage liquid 11 is guided to the designated area for simultaneously collecting the water and detecting the leakage through the detection device. Certainly, the arrangement of the plurality of connector components 4, 4*a* mating the inclined surfaces 50, 50*a*, 50*b* are adjustable in many of the aforementioned technical features according to the actual application requirements. The present disclosure is not limited thereto, and not redundantly described hereafter.

In summary, the present disclosure provides a leak-liquid guiding structure and a water-cooling and heat-dissipation system using the same. The leak-liquid guiding system is disposed correspondingly at a high-risk leakage location in the water-cooling and heat-dissipation system, so as to guide the leakage liquid to a designated area for collecting the leakage liquid or/and detecting the leakage through a detection device. When a heat exchange device of the water-cooling and heat-dissipation system is utilized to dissipate the heat generated from electronic device, the heat exchange device and the electronic device need to be connected through a plurality of male-and-female connectors, so that the coolant flows between the heat exchange device and the electronic device through the plurality of male-and-female connectors. An inclined surface of the leak-liquid guiding structure is disposed correspondingly below each connection port of male-and-female connectors in the water-cooling and heat-dissipation system where coolant leakage may occur. When the coolant is leaked from the connection port of any one of the plurality of male-and-female connectors, a leakage liquid is formed and flows along the corresponding inclined surface to a lateral wall of the heat exchange device or a lateral wall of the electronic device, so that the leakage liquid is collected to a water collection device or/and flows through a leak-liquid detection for detecting the leakage. Thus, the leakage liquid of the water-cooling and heat-dissipation system is efficiently integrated and concentrated, and the configuration of the leak-liquid detection device is simplified. For a connector component derived laterally from an installation surface in the water-cooling and heat-dissipation system, it allows connecting an inclined surface of the leak-liquid guiding to the installation surface to correspond to the joint component, so that the inclined surface is located below the corresponding connector component and configured to guide the leakage liquid overflowing from the connection port toward the installation surface or away from the installation surface by gravity. The leak-liquid guiding structure is fixed to the installation surface through a fastening element or a snap-in element. The inclined surface has for example a central section and two lateral sections, the central section is spatially corresponding to a lower edge of the connector component and laterally connected between the two lateral sections, and the central section is lower than the two lateral sections. Moreover, an end of the inclined surface away from the installation surface is higher than an end of the inclined surface adjacent to the installation surface, and a liquid collection opening is formed between the inclined surface of the leak-liquid guiding structure and the installation surface. With the arrangement, the leakage liquid is guided to the liquid collection opening through the inclined surface by gravity, and flows through the liquid collection opening. A leak-liquid detection device is further disposed correspondingly below the liquid collection opening. When the leakage liquid flows through the liquid collection opening, it allows to determine that the leakage liquid overflows from the connection port through the leak-liquid detection device. In addition, a water collection device is disposed correspondingly below the liquid collection opening, and the leakage liquid flowing through the liquid collection opening further flows along the installation surface by gravity, so as to be collected into the water collection device. In case of that a plurality of inclined surfaces spatially corresponding to a plurality of male-and-female connectors are arranged from top to bottom along the installation surface, it allows to set a water collection device at the bottom of the leak-liquid guiding structure or set a communication pipe for guiding from the liquid collection opening. In that, the leakage liquid is collected. On the other hand, it allows to combine the leak-liquid guiding structure with a plurality of inclined surfaces on a connection plate for being installed on the installation surface, so that the plurality of inclined surfaces are spatially corresponding to the connection ports of the plurality of male-and-female connectors arranged from top to bottom. The leak-liquid guiding structure is assembled to the connector component through the installation base and the guiding component, so as to be connected to the installation surface. The matching and the installation arrangement of the inclined surfaces of the leak-liquid guiding structure and the connection ports of connector components are adjustable according to the practical requirements.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A water-cooling and heat-dissipation system, comprising:

a heat exchange device for cooling a coolant;

an electronic device for warming up the coolant;

a plurality of male-and-female connectors disposed between the heat exchange device and the electronic device, so that the coolant is allowed to flow between the heat exchange device and the electronic device through the plurality of male-and-female connectors; and a plurality of leak-liquid guiding structures, wherein each of the plurality of leak-liquid guiding structures is disposed below a corresponding one of the plurality of male-and-female connectors, and each of the plurality of leak-liquid guiding structures comprises an inclined surface, wherein the inclined surface is introduced from a lateral wall of the heat exchange device or a lateral wall of the electronic device, and extended below a corresponding one of connection ports of the plurality of male-and-female connectors, wherein when the coolant is leaked from one of the connection ports of the plurality of male-and-female connectors, a leakage liquid is formed and flows along a corresponding one of the inclined surfaces to the lateral wall of the heat exchange device or the lateral wall of the electronic device, wherein the inclined surface comprises a central section and two lateral sections, the central section is spatially corresponding to a lower edge of each of male-and-female connectors and laterally connected between the two lateral sections, the central section is lower than the two lateral sections, and the two lateral sections of the inclined surface are lower than a higher edge of each of the plurality of male and female connectors.

2. The water-cooling and heat-dissipation system according to claim 1, wherein when the coolant flows to the electronic device through the plurality of male-and-female connectors, the coolant is heated up by the electronic device, wherein when the coolant flows to the heat exchange device through the plurality of male-and-female connectors, the coolant is cooled by the heat exchange device.

3. The water-cooling and heat-dissipation system according to claim 1, wherein after the leakage liquid flows along the corresponding one of the inclined surfaces to the lateral wall of the heat exchange device or the lateral wall of the electronic device, the leakage liquid is collected in a water-collection device, or/and flows through a leak-liquid detection device for detecting.

4. A leak-liquid guiding structure, configured to guide a leakage liquid leaked from a connection port, wherein the connection port is formed by a connector component, the connector component is derived laterally from an installation surface, and the leak-liquid guiding structure comprises:

an inclined surface connected to the installation surface, wherein the inclined surface is spatially corresponding to the connection port, located below the connection port, and configured to guide the leakage liquid overflowing from the connection port toward the installation surface or away from the installation surface by gravity, wherein the inclined surface comprises a central section and two lateral sections, the central section is spatially corresponding to a lower edge of the connector component and laterally connected between the two lateral sections, the central section is lower than the two lateral sections, and the two lateral sections of the inclined surface are lower than a higher edge of the connector component.

5. The leak-liquid guiding structure according to claim 4, wherein the connector component is connected between a heat exchange device and an electronic device, and comprises a plurality of male-and-female connectors, and the installation surface is on a lateral wall of the heat exchange device or a lateral wall of the electronic device, wherein the plurality of male-and- female connectors are arranged from top to bottom along the installation surface, the leak-liquid guiding structure comprises a plurality of inclined surfaces, and each of the plurality of inclined surfaces is correspondingly disposed below each of the plurality of male-and-female connectors, wherein the plurality of inclined surfaces are disposed on a connection plate, and connected to the installation surface through the connection plate.

6. The leak-liquid guiding structure according to claim 5, wherein the connection plate is fixed to the installation surface through a fastening element or a snap-in element.

7. The leak-liquid guiding structure according to claim 4, wherein an end of the inclined surface away from the installation surface is higher than an end of the inclined surface adjacent to the installation surface.

8. The leak-liquid guiding structure according to claim 4, further comprising a liquid collection opening, wherein the liquid collection opening is disposed adjacent to the installation surface, and located below a joining position of the connector component and the installation surface, wherein the leakage liquid overflowing from the connection port is guided to the liquid collection opening through the inclined surface by gravity, and flows through the liquid collection opening.

9. The leak-liquid guiding structure according to claim 8, further comprising a leak- liquid detection device disposed between the inclined surface and the installation surface and crossing below the liquid collection opening for detecting the leakage liquid when the leakage liquid flows through the liquid collection opening.

10. The leak-liquid guiding structure according to claim 8, further comprising a water collection device disposed below the inclined surface, spatially corresponding to the liquid collection opening, and configured to collect the leakage liquid flowing through the liquid collection opening.

11. The leak-liquid guiding structure according to claim 8, further comprising:

a water collection device located below the inclined surface; and a communication pipe connected between the liquid collection opening and the water collection device, and configured to guide the leakage liquid flowing through the liquid collection opening to the water collection device.

12. A leak-liquid guiding structure, configured to guide a leakage liquid leaked from a connection port, wherein the connection port is formed by a connector component, the connector component is derived laterally from an installation surface, and the leak-liquid guiding structure comprises:

an installation base disposed on the installation surface and connected to the connector component; and a guiding component connected to the installation base, wherein the guiding component comprises an upper liquid collection opening and an inclined surface, the upper liquid collection opening is disposed between installation base and the guiding component, and located below the connector component, and the inclined surface is spatially corresponding to the connection port, located below the connection port, and configured to guide the leakage liquid overflowing from the connection port to flow through the upper liquid collection opening, wherein the inclined surface comprises a central section and two lateral sections, the central section is spatially corresponding to a lower edge of the connector component and laterally connected between the two lateral sections, the central section is lower than the two lateral sections, and the two lateral sections of the inclined surface are lower than a higher edge of the connector component, wherein the installation base comprises a lower liquid collection opening in fluid communication with the upper liquid collection opening, and configured to guide the leakage liquid flowing through the upper liquid collection opening to flow through the lower liquid collection opening by gravity.

13. The leak-liquid guiding structure according to claim 12, wherein the installation base further comprises a flow guide channel in fluid communication between the upper liquid collection opening and the lower liquid collection opening, and configured to guide the leakage liquid flowing through the upper liquid collection opening to flow through the lower liquid collection opening by gravity.

14. The leak-liquid guiding structure according to claim 12, further comprising a leak-liquid detection device disposed between the inclined surface and the installation surface and crossing below the lower liquid collection opening for detecting the leakage liquid when the leakage liquid flows through the lower liquid collection opening.

15. The leak-liquid guiding structure according to claim 12, wherein an end of the inclined surface away from the installation surface is higher than an end of the inclined surface adjacent to the installation surface.

16. The leak-liquid guiding structure according to claim 12, wherein the inclined surface comprises a central section and two lateral sections, the central section is spatially corresponding to a lower edge of the connector component and laterally connected between the two lateral sections, and the central section is lower than the two lateral sections.

17. The leak-liquid guiding structure according to claim 12, wherein the connector component comprises two connector components arranged up and down on the installation surface, and the installation base comprises an upper mounting notch and a lower mounting notch connected to the two connector components, respectively.

18. The leak-liquid guiding structure according to claim 17, wherein each of the two connector components comprises a fixed connector and a jointing connector connected to each other through mating, so as to clamp a corresponding one of the upper mounting notch or the lower mounting notch and fix the installation base to the installation surface, wherein the upper mounting notch and the lower mounting notch face in opposite directions.

19. The leak-liquid guiding structure according to claim 12, wherein the installation base and the guiding component comprise a first engaging element and a second engaging element, respectively, and the first engaging element and the second engaging element are paired and engaged with each other for fixing the guiding component to the installation base.

* * * * *